United States Patent
Kanazawa et al.

(10) Patent No.: US 9,502,217 B2
(45) Date of Patent: *Nov. 22, 2016

(54) PLASMA PROCESSING APPARATUS AND PLASMA PROCESSING METHOD

(71) Applicant: Hitachi High-Technologies Corporation, Tokyo (JP)

(72) Inventors: Shunsuke Kanazawa, Kudamatsu (JP); Naoki Yasui, Kudamatsu (JP); Michikazu Morimoto, Kudamatsu (JP); Yasuo Ohgoshi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/609,807

(22) Filed: Jan. 30, 2015

(65) Prior Publication Data

US 2015/0144594 A1 May 28, 2015

Related U.S. Application Data

(63) Continuation of application No. 13/749,784, filed on Jan. 25, 2013, now Pat. No. 8,992,724.

(30) Foreign Application Priority Data

Nov. 27, 2012 (JP) .................................. 2012-258086

(51) Int. Cl.
*C23F 1/00* (2006.01)
*H01J 37/32* (2006.01)
(Continued)

(52) U.S. Cl.
CPC ............ *H01J 37/32311* (2013.01); *C23F 4/00* (2013.01); *H01J 37/32146* (2013.01); *H01J 37/32155* (2013.01); *H01J 37/32165* (2013.01); *H01J 37/32302* (2013.01); *H01L 21/32137* (2013.01)

(58) Field of Classification Search
CPC ...................... H01L 21/3065; H01L 21/31138; H01L 21/32137; H01J 37/32146; H01J 37/32155; H01J 37/32165; H01J 37/32311; H01J 37/323; C23F 4/00

USPC ............ 156/345.44, 345.48, 345.49, 345.43, 156/345.46; 438/9, 706, 707, 710, 712, 438/714, 720
See application file for complete search history.

(56) References Cited

U.S. PATENT DOCUMENTS

| 7,785,486 B2 | 8/2010 | Urban et al. |
| 8,992,724 B2 * | 3/2015 | Kanazawa ........ H01J 37/32146 156/345.44 |

(Continued)

FOREIGN PATENT DOCUMENTS

| JP | 8-250479 A | 9/1996 |
| JP | 2001-85394 A | 3/2001 |

(Continued)

OTHER PUBLICATIONS

Office Action issued Jan. 26, 2014 in Korean Patent Application No. 10-2013-7790 with partial English language translation.

(Continued)

*Primary Examiner* — Lan Vinh
(74) *Attorney, Agent, or Firm* — Miles & Stockbridge P.C.

(57) ABSTRACT

A plasma processing apparatus includes a processing chamber which plasma-processes a sample, a first high-frequency power supply which supplies first high-frequency power for plasma generation to the processing chamber, a second high-frequency power supply which supplies second high-frequency power to a sample stage on which the sample is placed and a pulse generation device which generate first pulses for time-modulating the first high-frequency power and second pulses for time-modulating the second high-frequency power. The pulse generation device includes a control device which controls the first and second pulses so that frequency of the first pulses is higher than frequency of the second pulses and the on-period of the second pulse is contained in the on-period of the first pulse.

4 Claims, 8 Drawing Sheets

(51) Int. Cl.
 *H01L 21/3213* (2006.01)
 *C23F 4/00* (2006.01)

(56) References Cited

U.S. PATENT DOCUMENTS

| | | | |
|---|---|---|---|
| 2004/0188239 A1* | 9/2004 | Robison | C23C 14/345 |
| | | | 204/192.3 |
| 2008/0110859 A1 | 5/2008 | Koshishi et al. | |
| 2010/0130018 A1* | 5/2010 | Tokashiki | H01J 37/32082 |
| | | | 438/710 |
| 2010/0248488 A1 | 9/2010 | Agarwal et al. | |
| 2011/0031216 A1* | 2/2011 | Liao | H01J 37/32082 |
| | | | 216/67 |
| 2011/0309049 A1 | 12/2011 | Papasouliotis et al. | |
| 2012/0052689 A1* | 3/2012 | Tokashiki | H01J 37/32091 |
| | | | 438/714 |

FOREIGN PATENT DOCUMENTS

| | | |
|---|---|---|
| KR | 10-2012-0022251 | 3/2012 |
| WO | 2011/156813 A1 | 12/2011 |

OTHER PUBLICATIONS

Office Action for related Japanese Application No. 2012-258086, mailing date Dec. 22, 2015.

\* cited by examiner

PLASMA PROCESSING APPARATUS AND PLASMA PROCESSING METHOD

BACKGROUND OF THE INVENTION

The present invention relates to a plasma processing apparatus and a plasma processing method and more particularly to a plasma processing apparatus and a plasma processing method of plasma-processing a sample while applying time-modulated high-frequency bias to the sample in the etching processing of the sample using the time-modulated plasma.

In the fabrication process of semiconductor devices, the dry-etching process using plasma is applied generally. Plasma processing apparatuses of various methods of performing dry-etching are employed.

In recent years, reduction in the processing size of related-art semiconductor devices made of silicon material basically to attain high performance and low cost of the semiconductor devices is reaching physical limitation. The time that technical nodes of semiconductor devices represented by logic semiconductor device circuits, DRAM's (Dynamic Random Access Memories) and flash memories are 20 to 10 nm is encountered and in order to achieve high performance of the devices using the technical nodes, new material and device structure which are not adopted in the manufacturing process of semiconductor devices used so far must be adopted. Actually, new material except silicon and new structure such as solid transistor are adopted as new measures for miniaturization of logic LSI's and semiconductor memories.

A demand required for a plasma processing apparatus used in the etching process upon manufacturing of semiconductor devices is also severe increasingly with great evolution of the material and the structure of semiconductor devices. Particularly, great improvement in miniaturization of processing size, etching selectivity and high-accuracy control of etch profile is demanded. The miniaturization of processing size is required to be maintained to be uniform in case where the technical node is shifted from 20-nm generation to 10-nm generation, the processing size that must be controlled in the etching process is scattered within the range of several nm to several angstroms and the scattering accuracy of the miniaturization processing is 12 to 18 inches in the diameter of a wafer.

Further, it is requested not only to control etching chemical reaction using related-art silicon material as basis but also to process new material such as III-V family, graphene and carbon nanotube with sufficient etching selectivity. In order to cope with the new material and the new structure represented by the high aspect ratio for realizing the solid transistor, it is indispensable not only to produce etching reaction considering only plasma density and incident energy of ions as a related-art plasma processing apparatus but also to produce etching reaction considering control of reactive radical species, control of electron temperature, control of ion flux, ratio of neutron flux and ion flux, control of dissociation degree and the like.

Actually, in order to complement difficulty in processing control of etching profile due to complicated multi-layer structure and solid structure, an attempt has been made to control the ion generation amount and the radical generation amount optimum to etching processing of laminated layers and structures.

As one method thereof, there is a method of generating plasma intermittently. For example, JP-A-8-250479 discloses that the etching processing process of the dry etching includes a first period A containing the elementary process where reactive species is absorbed to the surface mainly, a second period B containing the elementary process where the surface is irradiated with particles accelerated so as to promote reaction of absorption reactive species and material and a third period C containing the elementary process where reactive products are detached from the surface to be discharged and the processing process including the first to third periods A, B and C is periodically performed on a cycle of 1 msec to 1 sec.

Further, as a method of controlling the etching profile using pulsed plasma, U.S. Pat. No. 7,785,486 discloses that pulse frequency of the pulsed plasma is increased to an odd multiple of frequency of modulation pulse train for high-frequency bias.

These related techniques are concerned with the technique of generating plasma intermittently in order to control the etching profile with high accuracy. In these related techniques, energy for generating plasma is modulated regularly in a plasma generation apparatus which generates plasma in a plasma processing apparatus. For example, energy is turned on and off or energy is modulated to be applied to plasma. When energy for generating plasma is high level, generation of ions is increased as compared with generation of radical whereas when energy for generating plasma is low level, generation of radical is increased as compared with generation of ions.

Further, ionic species and radical species unnecessary to control the etching selectivity and the etching profile are controlled by turning on and off energy or modulating energy. In this manner, the ion generation amount and the radical generation amount are controlled with high accuracy to improve the processing accuracy.

SUMMARY OF THE INVENTION

As a result of continuing unremitting study about the related-art structure, the Inventors have found that processing accuracy is improved to some degree in the related-art etching process of semiconductor devices but there is limitation in the etching process of new material and solid transistor of new structure in recent years and the following points are enumerated about its cause.

JP-A-8-250479 and U.S. Pat. No. 7,785,486 disclose combination of time modulation of the pulsed plasma generator for generating plasma intermittently and a high-frequency bias power supply for impinging ions on wafer in the plasma processing apparatus. However, it is understood that a peak-to-peak voltage (Vpp) of output voltage of the high-frequency bias power supply is not considered in synchronization of the time modulation of the pulsed plasma and the high-frequency bias power supply and there is limitation in the etching process of new material and solid transistor of new structure in recent years.

In the structure of JP-A-8-250479 and U.S. Pat. No. 7,785,486, it is not considered that when electric power of the high-frequency bias power supply is applied to wafer at the time that energy for generating plasma is low level in the pulsed plasma, the peak-to-peak voltage (Vpp) of the output voltage of the high-frequency bias power supply is increased remarkably and the etching rate of mask material functioning as a mask for material to be etched is increased remarkably due to the remarkably increased peak-to-peak voltage (Vpp) of the output voltage. Consequently, the etching selectivity is reduced remarkably.

Further, since such consideration is not given as described above, JP-A-8-250479 and U.S. Pat. No. 7,785,486 do not also consider suppression in reduction of the plasma density utilizing afterglow plasma and maintenance of the plasma density and there is not any disclosure thereof. Even if the technique of generating plasma intermittently as disclosed in JP-A-8-250479 and U.S. Pat. No. 7,785,486 is used, there is limitation in the etching process of new material and solid transistor of new structure in recent years and it is not yet sufficient to improve the etching selectivity and process the etching profile with high accuracy.

It is an object of the present invention to provide a plasma processing apparatus and a plasma processing method capable of suppressing reduction in plasma density by utilizing afterglow discharge.

According to an aspect of the present invention, there is provided with a plasma processing apparatus which includes: a processing chamber which plasma-processes a sample; a first high-frequency power supply which supplies first high-frequency power for plasma generation to the processing chamber; a second high-frequency power supply which supplies second high-frequency power to a sample stage on which the sample is placed; and a pulse generation device which generates first pulses to time-modulate the first high-frequency power and second pulses to time-modulate the second high-frequency power, wherein the pulse generation device includes a control device which controls the first and second pulses so that a frequency of the first pulses is higher than a frequency of the second pulses and an on-period of the second pulse is contained in an on-period of the first pulse.

According to an aspect of the present invention, there is provided with a plasma processing method of plasma-processing a sample using a plasma processing apparatus which includes a processing chamber to plasma-process the sample, a first high-frequency power supply configured to supply first high-frequency power for plasma generation to the processing chamber, a second high-frequency power supply configured to supply second high-frequency power to a sample stage on which the sample is placed and a pulse generation device configured to generate first pulses to time-modulate the first high-frequency power and second pulses to time-modulate the second high-frequency power, the method including the step of: plasma-processing the sample while the high-frequency power time-modulated by the second pulses is supplied to the sample stage using the plasma time-modulated by the first pulses, and wherein a frequency of the first pulses is made higher than a frequency of the second pulses and an on-period of the second pulse is made to be contained in an on-period of the first pulse.

According to the present invention, the afterglow discharge can be utilized to suppress reduction in plasma density.

Other objects, features and advantages of the invention will become apparent from the following description of the embodiments of the invention taken in conjunction with the accompanying drawings.

DETAILED DESCRIPTION OF THE EMBODIMENT

Figure 1:
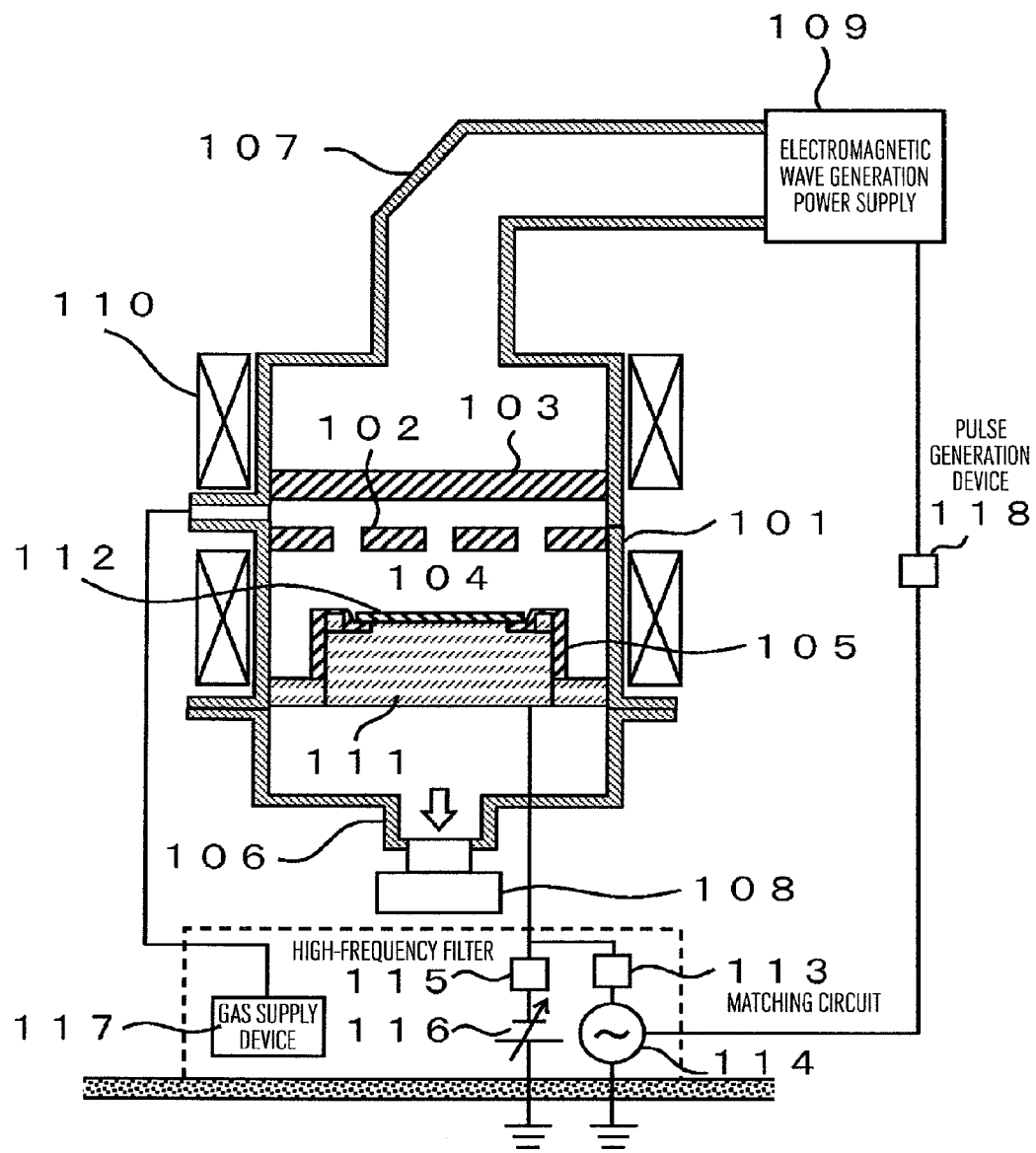
FIG. 1 is a longitudinal sectional view of a plasma etching apparatus according to the present invention.

An embodiment of the present invention is now described with reference to the accompanying drawings. First, a microwave electron cyclotron resonance (ECR) etching apparatus according to the present invention is described with reference to FIG. 1:

A dielectric window 103 (made of quartz, for example) for enclosing etching gas in a vacuum vessel 101 is disposed at an upper part of the vacuum vessel 101 having the top opened to thereby form a processing chamber 104. Further, a shower plate 102 (made of quartz, for example) for introducing the etching gas into the vacuum vessel 101 is disposed at upper part of the vacuum vessel 101 and is connected to a gas supply device 117 for supplying the etching gas through the shower plate 102. Further, the vacuum vessel 101 is connected to a vacuum exhaust or decompression device 108 through a vacuum exhaust or decompression outlet 106.

As a plasma generation apparatus, a power supply 109 for generating electromagnetic wave (electromagnetic wave generation power supply) is installed. In order to transmit electric power for generating plasma to the processing chamber 104, a wave guide 107 is disposed above the dielectric window 103. The electromagnetic waves transmitted to the wave guide 107 are generated from the electromagnetic wave generation power supply 109. The frequency of electromagnetic waves is not limited particularly, although, in the embodiment, microwave of 2.45 GHz is used. When the microwave is used, electric power generated from the electromagnetic wave generation power supply 109 is microwave electric power. A magnetic field generation coil 110 for forming a magnetic field is disposed on an outer peripheral part of the processing chamber 104 and high-frequency electric power generated by the electromagnetic wave generation power supply 109 interacts with the formed magnetic field to generate high-density plasma in the processing chamber 104.

A wafer mounting electrode 111 which is a sample stage or pedestal is disposed at lower part of the vacuum vessel 101 in opposing relationship with the dielectric window 103. The wafer mounting electrode 111 has the electrode surface covered by sprayed film (not shown) and is connected to a DC power supply 116 through a high-frequency filter 115.

In order to prevent the wafer mounting electrode 111 from being directly exposed to plasma, a cover ring 105 is disposed around the wafer mounting electrode 111. Further, the wafer mounting electrode 111 is connected through a matching circuit 113 to a high-frequency power supply 114. The frequency of high-frequency bias electric power supplied by the high-frequency power supply 114 is not limited particularly, although in the embodiment the high frequency of 400 kHz is used.

A wafer 112 that is a sample carried within the processing chamber 104 is absorbed on the wafer mounting electrode 111 by electrostatic force of DC voltage applied from the DC power supply 116 and after desired etching gas is supplied in the processing chamber 104, pressure in the vacuum vessel 101 is set to predetermined pressure to generate plasma in the processing chamber 104. High-frequency bias power is applied from the high-frequency power supply 114 connected to the wafer mounting electrode 111 to draw ions from plasma to wafer, so that the wafer 112 is subjected to etching processing.

When pulse-modulated plasma is generated in the processing chamber 104, the electromagnetic wave generation power supply 109 turns on and off supply of microwave power to the processing chamber 104 regularly. In order to generate the pulse-modulated plasma, energy is supplied from the electromagnetic wave generation power supply 109 during on-period (1 microsecond to 1 second, for example) of the modulation pulse to generate plasma, so that the ion and radical generation amounts in the processing chamber 104 are increased.

Further, supply of energy from the electromagnetic wave generation power supply 109 is stopped during off-period (1 microsecond to 1 second, for example) of the modulation pulse, so that the ion and radical generation amounts in the processing chamber 104 are reduced.

Moreover, when the pulse-modulated high-frequency bias power is applied to the wafer 112 placed on the wafer mounting electrode 111, the high-frequency power supply 114 turns on and off supply of the high-frequency bias power to the wafer 112 regularly. In order to pulse-modulate the high-frequency bias power, the high-frequency bias power is supplied from the high-frequency power supply 114 during on-period (1 microsecond to 1 second, for example) of the modulation pulse, so that ion energy incident on the wafer 112 is increased.

Furthermore, supply of the high-frequency bias power from the high-frequency power supply 114 is stopped during off-period (1 microsecond to 1 second, for example) of the modulation pulse, so that ion energy incident on the wafer 112 is reduced.

Moreover, in order to synchronize the microwave power generated by the electromagnetic wave generation power supply 109 with the high-frequency power supplied from the high-frequency power supply 114 to make time modulation, a pulse generation device 118 is provided. The pulse generation device 118 is connected to the electromagnetic wave generation power supply 109 and the high-frequency power supply 114 and transmits modulation pulse signals synchronized with each other to the electromagnetic wave generation power supply 109 and the high-frequency power supply 114.

Further, the pulse generation device 118 includes a circuit for controlling supply timing of the high-frequency power supplied from the electromagnetic wave generation power supply 109 and the high-frequency power supply 114.

Furthermore, even if pulse modulation timing in the electromagnetic wave generation power supply 109 and pulse modulation timing in the high-frequency power supply 114 are synchronized with each other, the pulse modulation timings of plasma in the processing chamber 104 are not synchronized sometimes. In this case, delay operation that is delay time can be set in the pulse generation device 118 for synchronization of the modulation pulse signal of the electromagnetic wave generation power supply 109 and the modulation pulse signal of the high-frequency power supply 114, so that timing of the modulation pulse of the electromagnetic wave generation power supply 109 can be synchronized with timing of the modulation pulse of the high-frequency pulse in plasma.

Further, the microwave ECR etching apparatus of the present invention includes a control device (not shown) for controlling the vacuum decompression device 108, the gas supply device 117, the electromagnetic wave generation power supply 109, the magnetic field generation coil 110, the DC power supply 116 and the high-frequency power supply 114. The control device is connected to a recording medium which can be utilized by a computer and in which control programs and control variables for devices and power supplies to be controlled are stored and operates the devices and power supplies in accordance with the stored control programs and control variables, so that the wafer 112 is subjected to etching processing.

Figure 2:
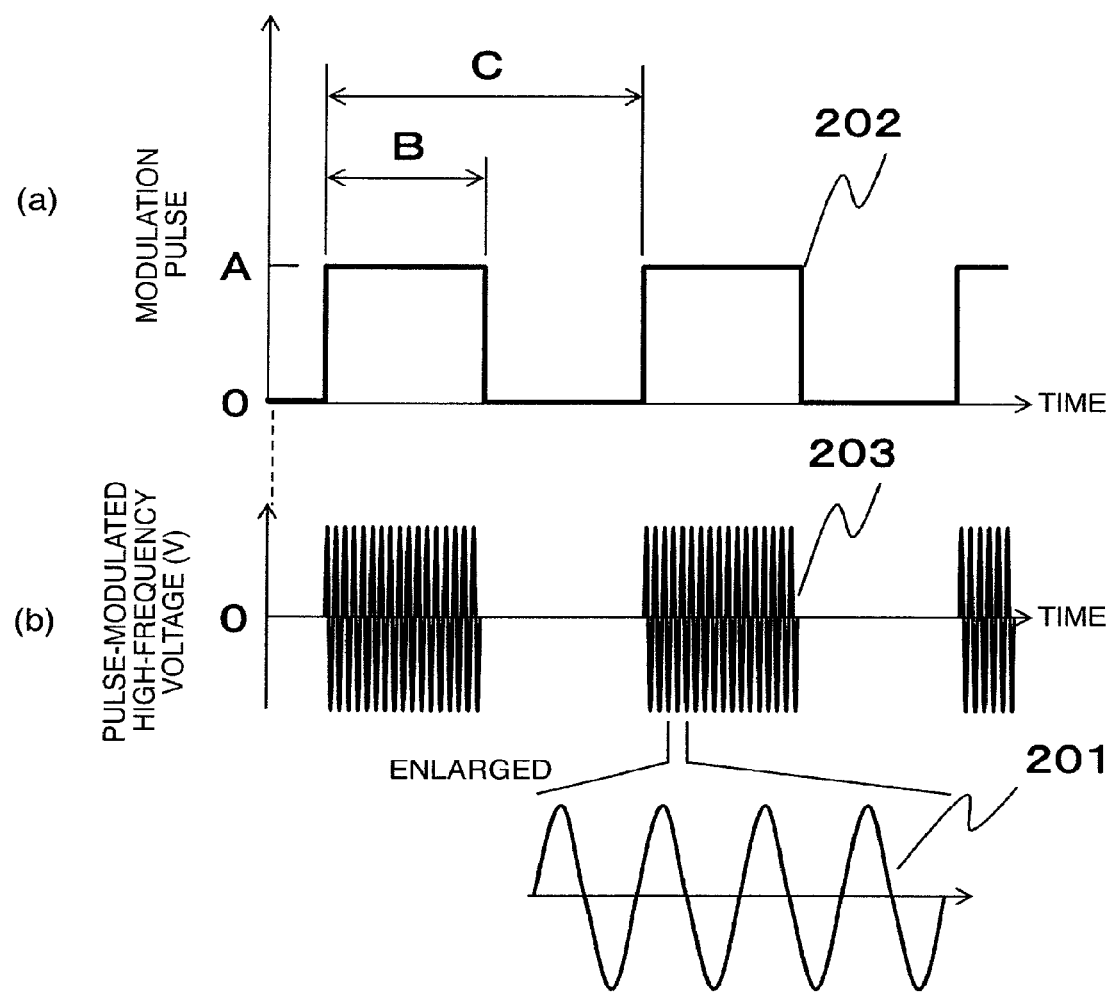
FIG. 2 shows microwave electric power subjected to time modulation.

Next, the pulse-modulated microwave power that is an example in case where time-modulated plasma is generated in the processing chamber 104 is shown in (b) of FIG. 2. Curve 201 represents voltage waveform of microwave generated by the electromagnetic wave generation power supply 109 and the voltage waveform is a substantially sine wave of 2.45 GHz.

Waveform 202 shown in (a) of FIG. 2 represents pulse waveform for modulating microwave power generated from the electromagnetic wave generation power supply 109. An amplitude during on-period B of the modulation pulse is A, a period at which the on-period B is repeated is C and the ratio of on-period B of the modulation pulse of microwave power to the period C is defined to be a duty ratio (%).

When the voltage waveform of microwave represented by the curve 201 is modulated by the pulse represented by the waveform 202, the voltage waveform represented by waveform 203 is obtained. The high-frequency bias power supplied from the high-frequency power supply 114 is also pulse-modulated as shown in (b) of FIG. 2.

Next, a measure of pulse-modulating the microwave power and the high-frequency bias power according to the present invention is described with reference to FIG. 3.

Figure 3:
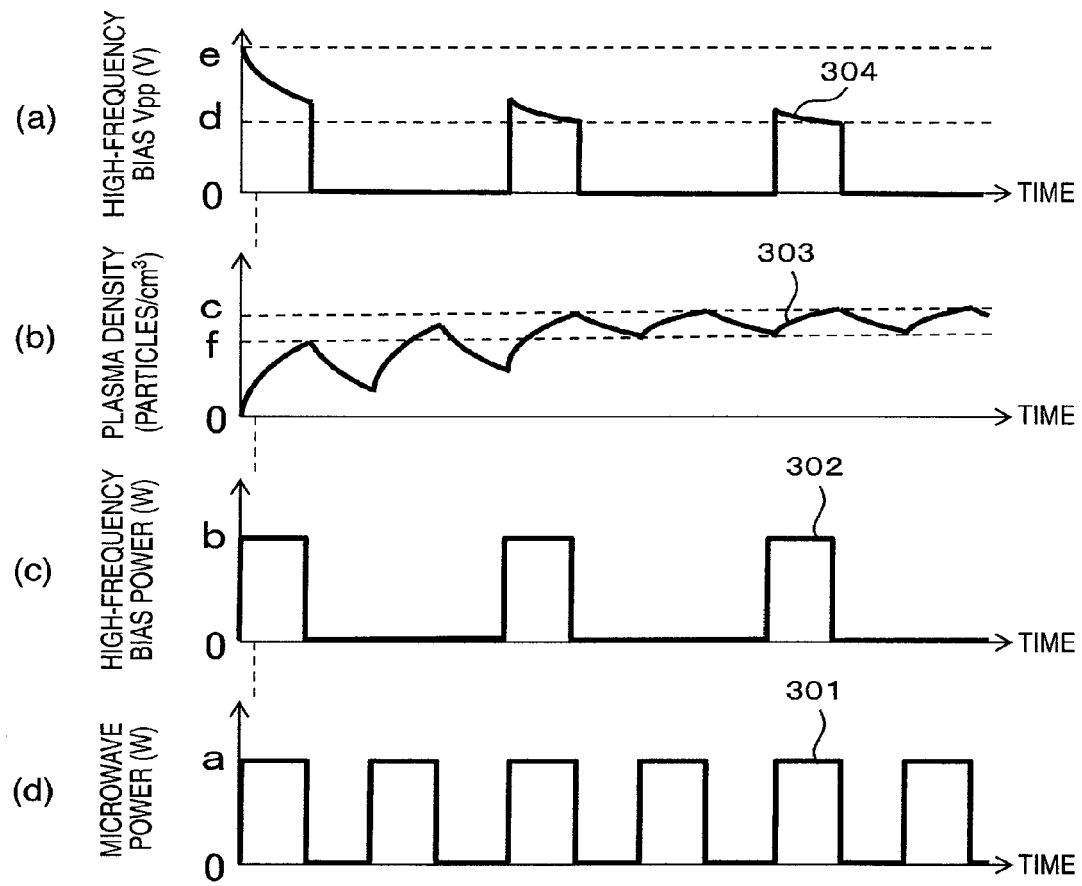
FIG. 3 shows a concept of an embodiment of the present invention.

FIG. 3 shows the modulation pulse of the microwave power, the modulation pulse of the high-frequency bias power, the time dependency of the plasma density in the processing chamber 104 and the time dependency of the peak-to-peak voltage (hereinafter referred to as Vpp) generated in the wafer 112 by the RF bias power in case where microwave power supplied from the electromagnetic wave generation power supply 109 is pulse-modulated and the high-frequency bias power supplied from the high-frequency power supply 114 is pulse-modulated.

Waveform 301 shown in (d) of FIG. 3 represents modulation pulse of the microwave power and an amplitude of this modulation pulse during on-period is a. Further, waveform 302 shown in (c) of FIG. 3 represents modulation pulse of the high-frequency bias power and an amplitude of this modulation pulse during on-period is b.

Moreover, the frequency of the modulation pulse of the microwave power is assumed to be higher than that of the high-frequency bias power. In addition, the frequency of the modulation pulse of the microwave power is assumed to be higher than or equal to the frequency at which afterglow discharge can be maintained and to be lower than or equal to the frequency at which side etching caused by active radical is generated. In the embodiment, the frequency of the modulation pulse of the microwave power is assumed to be two times as high as the frequency of the modulation pulse of the high-frequency bias power.

Further, the modulation pulse of the high-frequency bias power is synchronized with the modulation pulse of the microwave power so that the on-period of the modulation pulse of the high-frequency bias power is always contained in the on-period of the modulation pulse of the microwave power. In addition, the off-period of the modulation pulse of the high-frequency bias power is assumed to be calculated on the basis of the time that reactive products produced by plasma etching can be discharged sufficiently.

Next, the time dependency of plasma density (particles/cm$^3$) in the processing chamber 104 in case where the modulation pulse of the microwave power is synchronized with the modulation pulse of the high-frequency bias power to time-modulate the microwave power and the high-frequency bias power as described above is shown by curve 303 (in (b) of FIG. 3). As shown by curve 303, the plasma density is increased from just after the microwave power is supplied and after the plasma density reaches f (particles/cm3), the plasma density is reduced due to turning off of the microwave power, so that afterglow is formed. The afterglow is plasma maintained after supply of the microwave power for plasma generation is turned off until the microwave power is supplied again and changes depending on an output value of the microwave power, on-time of the microwave power, kind of gas, processing pressure and the like.

However, since the microwave power at next period is supplied during the afterglow, the plasma density is increased from certain density (≠0) again and is reduced by turning off of the microwave power, so that the afterglow is formed. In this manner, increase of the plasma density and the afterglow are repeated, so that the plasma density reaches the saturation density c (particles/cm$^3$) gradually.

Even after the plasma density reaches the saturation density c, the microwave power at next period is supplied before the plasma density is reduced large and accordingly the plasma density is maintained as shown by curve 303 without being increased to high density and reduced large.

Further, curve 304 (shown in (a) of FIG. 3) shows the time dependency of Vpp having the same time axis as the curve 303 and generated in the wafer 112 by application of the high-frequency bias power. As shown by the curve 304, just after the microwave is supplied, the plasma density is small and impedance of the plasma itself is large. Accordingly, Vpp generated in the wafer 112 rises to e(V). Then, Vpp is reduced as the plasma density is increased. However, the reduced Vpp is larger than d(V) that is Vpp reached after the plasma density reaches the saturation density c.

Moreover, the plasma density for Vpp after the second period nearly reaches the saturation density c and accordingly Vpp after the second period has the substantially same value as d(V). This reason is that the frequency of the modulation pulse of the microwave power is higher than that of the high-frequency bias power.

Figure 4:
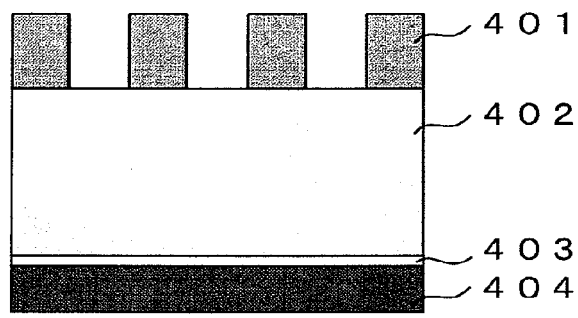
FIG. 4 is a sectional view of a wafer which is not subjected to plasma etching.

Next, an example where the wafer having the structure shown in FIG. 4 is plasma-etched according to the present invention is described.

First, an example of a section of the wafer which is not plasma-etched is shown in FIG. 4. The wafer which is not plasma-etched according to the present invention includes undercoating material 403 (for example, silicon oxide layer or the like) formed on substrate material 404 (for example, silicon substrate or the like) as shown in FIG. 4 and further material 402 to be etched (for example, polysilicon layer or the like) is formed on the material 403. Moreover, mask material 401 (for example, silicon oxide layer, silicon nitride layer, photo-resist layer or the like) which is patterned to a desired circuit pattern by lithography process beforehand is formed on the material 402 to be etched.

Figure 5:
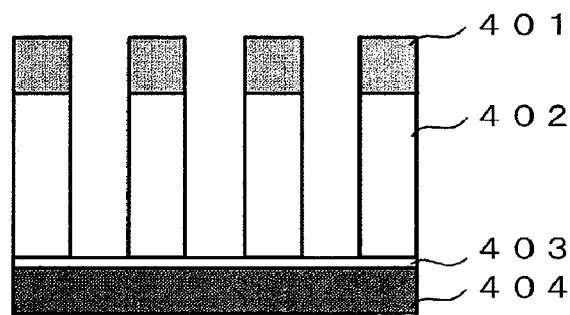
FIG. 5 is a schematic diagram showing a section having a profile subjected to plasma etching according to the present invention.

Next, a section in case where the wafer as shown in FIG. 4 was plasma-etched according to the present invention is shown in FIG. 5.

In the plasma etching method according to the present invention, the reactive products produced by etching are discharged from inner part of pattern of the material to be etched in the off state of the high-frequency bias and accordingly the etching reaches the undercoating material 403. Further, as shown by the curve 303, plasma is not maintained to high density and accordingly the side etch caused by active radical is not also produced. Hence, as shown in FIG. 5, the material 402 to be etched can be etched to a desired profile having no side etch.

Further, since the plasma density is small just after supply of the microwave power, Vpp generated in the wafer is large (e(V)) and energy of ions incident to the wafer is large, although the plasma density after the second period approaches the saturation density c and accordingly excessive increase of Vpp is avoided. Hence, since the time that Vpp is in the high state is short to the degree that it can be neglected as compared with the etching time, reduction in mask selectivity is suppressed to a minimum.

As described above, according to the present invention, since the modulation pulse of the high-frequency bias power is synchronized with the modulation pulse of the microwave power so that the on-period of the modulation pulse of the high-frequency bias power is always contained in the on-period of the modulation pulse of the microwave power and the frequency of the modulation pulse of the microwave power is higher than the frequency of the modulation pulse of the high-frequency bias power, remarkable increase of Vpp can be suppressed, so that reduction in the mask selectivity can be suppressed. The mask selectivity is the ratio of the etching speed of the material 402 to be etched to the etching speed of the mask material 401.

Further, according to the present invention, since the plasma is not maintained in high density, side etch of undesirable etching profile can be suppressed and high-accuracy control of the etching profile and production efficiency of semiconductor devices can be improved.

Next, the reason that the present invention can attain the above remarkable effects is described.

Figure 6:
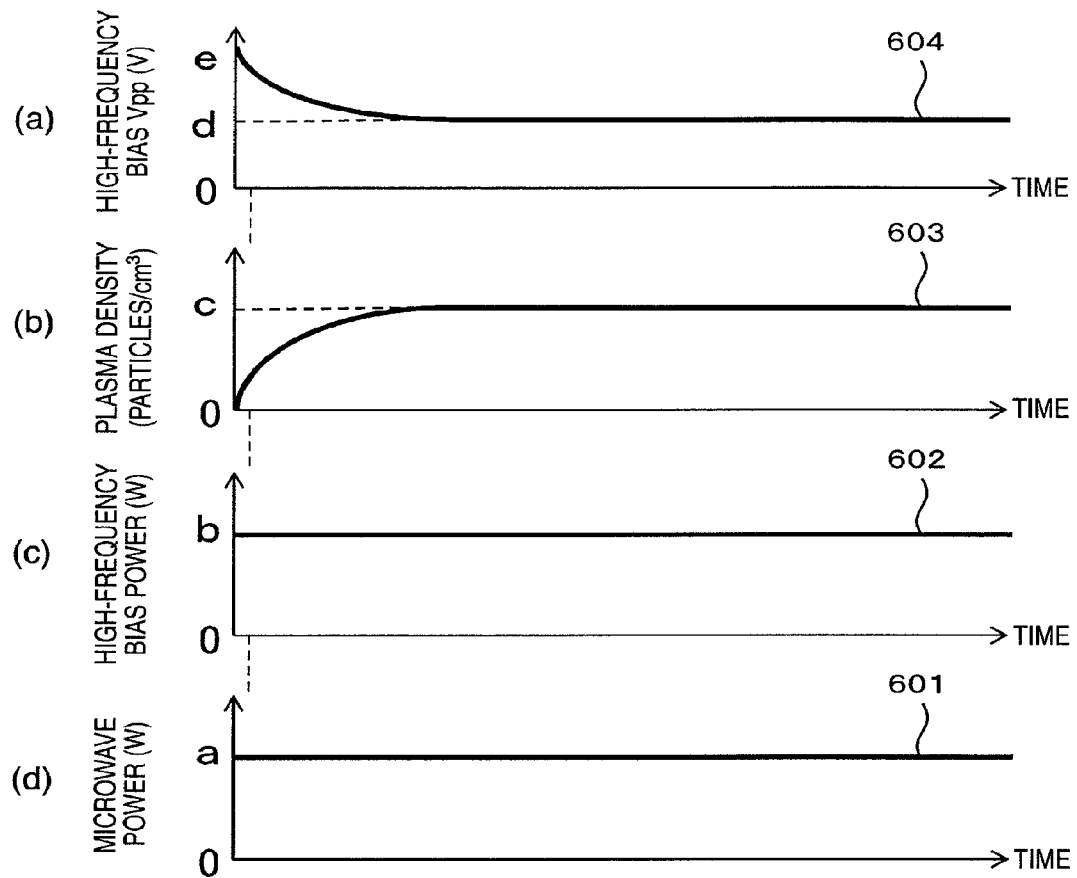
FIG. 6 shows plasma density and Vpp in the related art.

First, when the microwave power and the high-frequency bias power are not time-modulated, the plasma density is increased as shown by curve 603 in (b) of FIG. 6 from just after the microwave power is supplied and reaches the saturation density c after a fixed time. In this case, the microwave power is fixed power a (W) as shown by waveform 601 in (d) of FIG. 6 irrespective of time and the high-frequency bias power is also fixed power b (W) as shown by waveform 602 in (c) of FIG. 6 irrespective to time.

Further, just after supply of the microwave power, the plasma density is small and the fixed time is required until the saturation density c is reached. Accordingly, impedance of the plasma itself is enlarged and Vpp rises to e(V) transitionally as shown by curve 604 in (a) of FIG. 6. Thereafter, as the plasma density is saturated, Vpp is also saturated to d(V).

Figure 7:
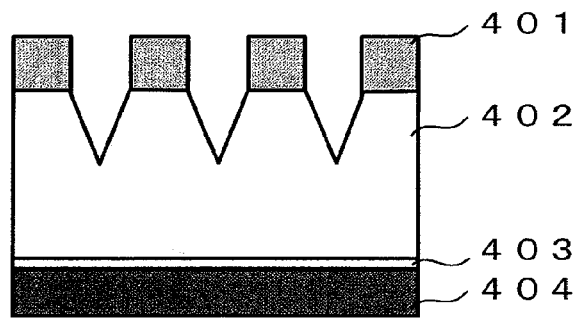
FIG. 7 is a schematic diagram showing a section having a profile subjected to plasma etching in the related art.

Next, a section in case where the wafer as shown in FIG. 4 was plasma-etched without time-modulating the microwave power and the high-frequency bias power is shown in FIG. 7. As shown in FIG. 7, the material 402 to be etched is not etched into a desired profile and the side wall of the material 402 is formed to be tapered, so that the state that etching is stopped (etch stop) occurs.

When miniaturization of etching processing is accelerated and the profile of the material 402 to be etched is formed to have high aspect ratio, the reactive products produced by etching are not discharged from the inner part of pattern of the material to be etched and are deposited on the side wall and pattern bottom of the material to be etched. Accordingly, etching is not performed so as to reach the undercoating material 403 and the state that etching is stopped (etch stop) occurs, so that the wafer is formed as shown in FIG. 7.

Further, since the plasma density is small just after supply of the microwave power, Vpp is made high and energy of ions incident on the wafer is also increased. Accordingly, the selectivity of the mask material 401 is reduced, although since the time that Vpp is in the high state is transitional until the plasma density is saturated and is short to the degree that it can be neglected as compared with the etching time, reduction in mask selectivity can be suppressed to a minimum.

Next, the case where only the high-frequency bias power is time-modulated without time-modulating the microwave power in order to improve the profile in etch stop as shown in FIG. 7 is described. In this case, the plasma density is increased as shown by curve 803 in (b) of FIG. 8 from just after the microwave power is supplied and reaches the saturation density c after a fixed time. In this case, it is supposed that the microwave power is fixed power a (W) as shown by waveform 801 in (d) of FIG. 8 irrespective of time and the high-frequency bias power is modulated by pulse waveform having an amplitude b as shown by waveform 802 in (c) of FIG. 8.

Figure 8:
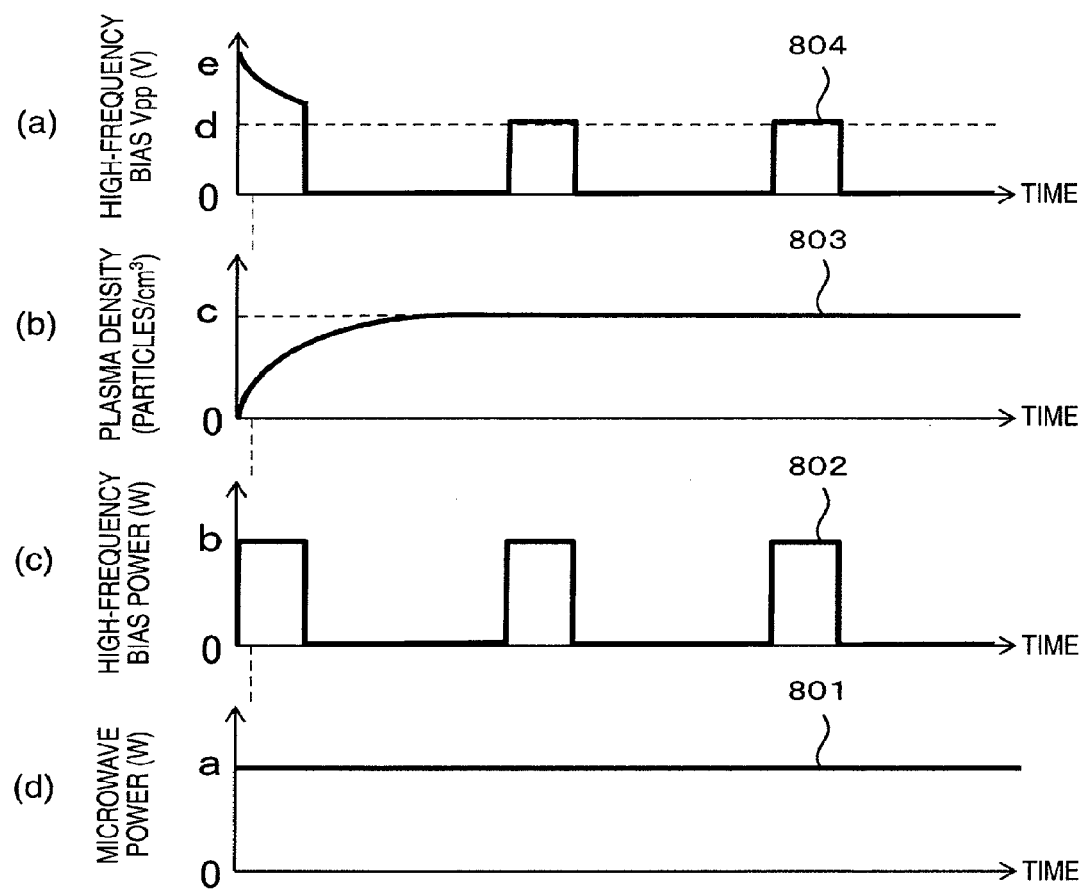
FIG. 8 shows plasma density and Vpp in the related art.

Further, since the plasma density is small and impedance of the plasma itself is large just after supply of the microwave power, Vpp is increased to e(V) as shown by curve 804 in (a) of FIG. 8 and is reduced as the plasma density is saturated. Moreover, after the second period generated after the plasma density is saturated, Vpp has pulse waveform of amplitude d synchronized with the waveform 802.

Figure 9:
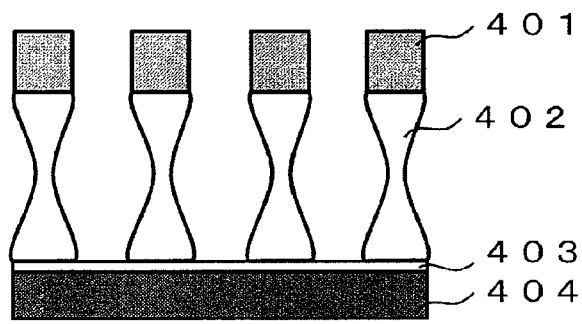
FIG. 9 is a schematic diagram showing a section having a profile subjected to plasma etching in the related art.

Next, a section in case where the wafer as shown in FIG. 4 was plasma-etched while only the high-frequency bias power is time-modulated without time-modulating the microwave power is shown in FIG. 9. As shown in FIG. 9, the material 402 to be etched is not etched into a desired profile and the side wall of the material 402 to be etched is formed into bowing shape. This bowing shape is formed by the following reason.

Since the reactive products produced by etching are discharged from the inner part of pattern of the material to be etched when the high-frequency bias power is off, deposit on the bottom of pattern having the high aspect ratio is reduced and etching is attained to reach the undercoating material 403 without etch stop. However, since the plasma density is in the high-density state as shown by curve 803 in (b) of FIG. 8 when the high-frequency bias power is off, the side etch occurs by active radical produced in plasma to thereby cause the bowing shape.

Further, since the plasma density is small just after supply of the microwave power, Vpp is increased and energy of ions incident on the wafer is also increased. Accordingly, the selectivity of the mask material 401 is reduced, although since the time that Vpp is in the high state is transitional until the plasma density is saturated and is short to the degree that it can be neglected as compared with the etching time, reduction in mask selectivity can be suppressed to a minimum.

Next, the case where the microwave power and the high-frequency bias power are both time-modulated in order to improve the bowing shape as shown in FIG. 9 is described. The plasma density in this case is increased as shown by curve 1003 in (b) of FIG. 10 from just after supply of the microwave power and after the plasma density reaches f (particles/cm$^3$), the plasma density is reduced gradually by off of the microwave power to form the afterglow. Thereafter, the plasma density is substantially equal to 0 (particle/cm$^3$) and is increased again by supply of the microwave power at next period.

Figure 10:
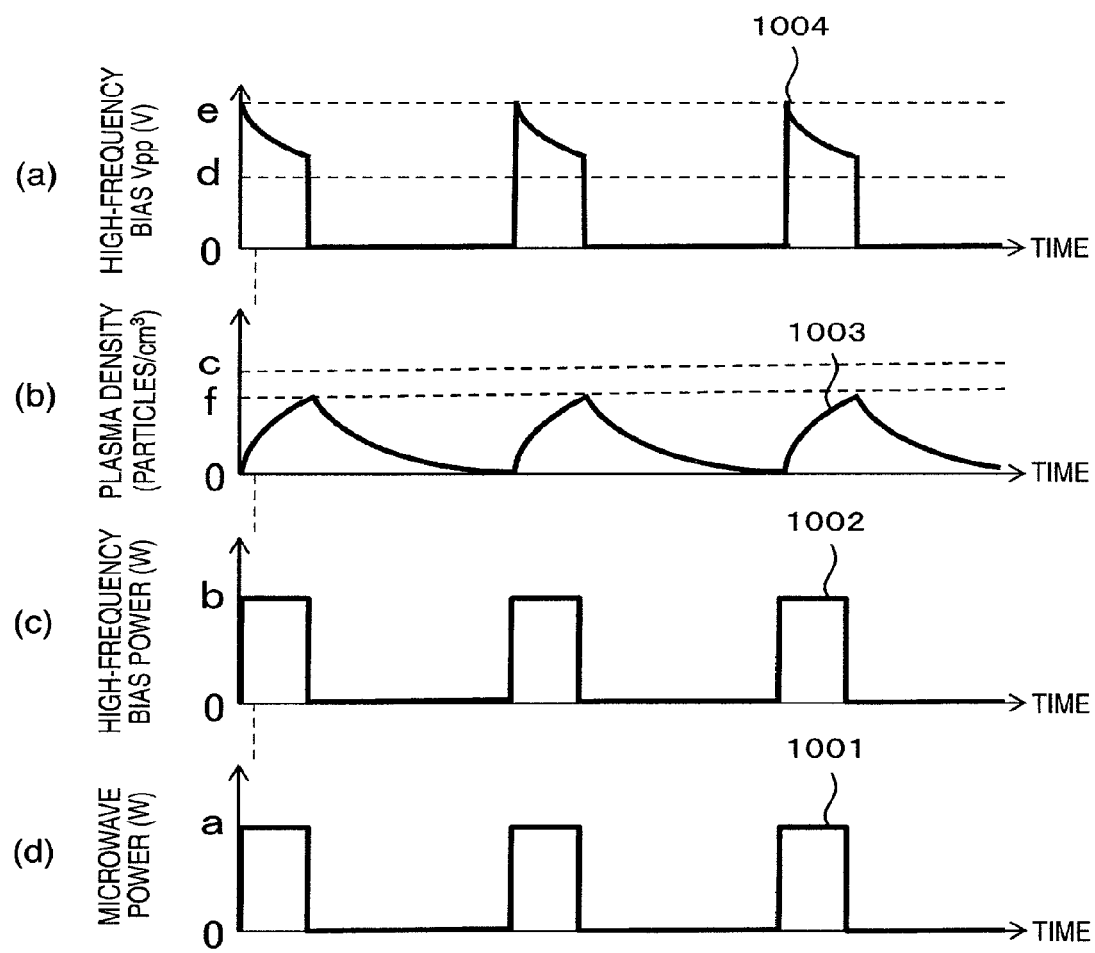
FIG. 10 shows plasma density and Vpp in the related art.

Further, in this case, the microwave power is modulated by pulse waveform of amplitude a as shown by waveform 1001 in (d) of FIG. 10 and the high-frequency bias power is modulated by pulse waveform of amplitude b as shown by waveform 1002 in (c) of FIG. 10. Furthermore, it is assumed that the modulation pulse of the high-frequency bias power is synchronized with the modulation pulse of the microwave power.

Moreover, the plasma density at the beginning of supply of the microwave power is 0 (particle/cm$^3$) at every period as shown by curve 1003 in (b) of FIG. 10 and the plasma density does not reach the saturation density c during on-period of the modulation pulse. Accordingly, impedance of the plasma itself is increased during on-period of the modulation pulse of the microwave power and Vpp is larger at every period as shown by curve 1004 in (a) of FIG. 10 as compared with d(V) that is Vpp after the plasma density reaches the saturation density c.

Figure 11:
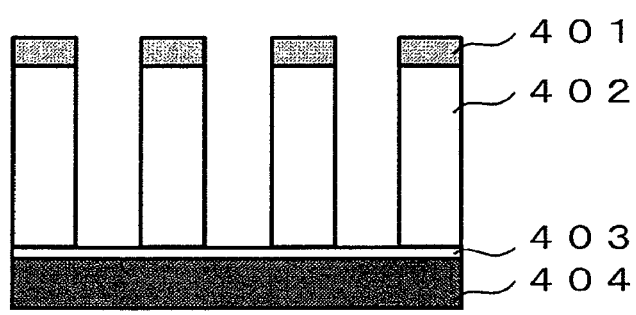
FIG. 11 is a schematic diagram showing a section having a profile subjected to plasma etching in the related art.

Next, a section in case where the wafer as shown in FIG. 4 was plasma-etched while the microwave power and the high-frequency bias power are both time-modulated is shown in FIG. 11. As shown in FIG. 11, the material 402 to be etched is etched into a desired profile in which bowing is improved. This reason is as follows.

The reactive products produced by etching are discharged from the inner part of pattern of the material to be etched when the high-frequency bias power is off and accordingly etching is attained to reach the undercoating material 403. Further, when the high-frequency bias power is off, plasma density is not maintained to be high density as shown by curve 1003 in (b) of FIG. 10 and accordingly the side etch caused by active radical is not produced.

However, since Vpp at application of RF bias power is increased at every period of modulation pulse, energy of ions incident on the wafer is increased, so that the selectivity of the mask material 401 is reduced.

On the other hand, the frequency of modulation pulse of the microwave power in the present invention is higher than that of the high-frequency bias power and accordingly afterglow discharge is maintained even when the microwave power is off. Consequently, the plasma density of the present invention is apt to reach the saturation density c and Vpp at on-period of the high-frequency bias power can be prevented from being increased. Hence, according to the present invention, the selectivity of the mask material 401 can be improved while the desired profile having no bowing is maintained.

In other words, according to the present invention, the frequency of modulation pulse of the microwave power is made higher than or equal to the frequency at which afterglow discharge is maintained at least and the frequency of modulation pulse of the high-frequency bias power is made lower than that of the microwave power. Further, the on-period of modulation pulse of the high-frequency bias power is made to be contained in the on-period of modulation pulse of the microwave power.

Figure 12A:
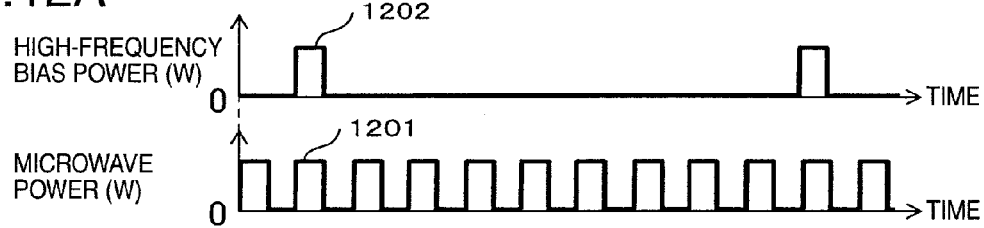
FIGS. 12A to 12E show a concept of an embodiment of the present invention and particularly show the relation of high-frequency bias power and microwave power.

Next, other embodiments according to the present invention except the above-mentioned embodiment are described with reference to FIGS. 12A to 12E. FIG. 12A shows a case where frequency of modulation pulse 1201 of the microwave power is ten times as high as frequency of modulation pulse 1202 of the high-frequency bias power. Further, the on-period of modulation pulse of the microwave power in this case is equal to that of the high-frequency bias power.

In this manner, the microwave power and the high-frequency bias power can be modulated to thereby reduce Vpp as compared with the case of the embodiment shown in FIG. 3 and further improve the mask selectivity.

Figure 12B:
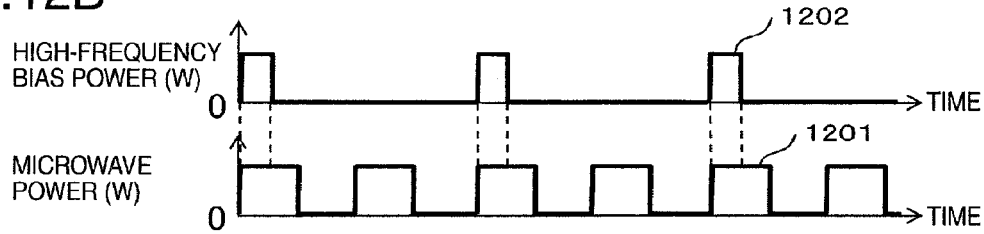

Next, the case where the on-period of the modulation pulse 1202 of the high-frequency bias power is further shorter than that of the case of the embodiment shown in FIG. 3 is shown in FIG. 12B. Even in this case, the application time of Vpp can be reduced as compared with the case of the embodiment shown in FIG. 3 and the mask selectivity can be further improved. Moreover, since the time required to discharge the reactive products from the bottom of pattern having the high aspect ratio can be lengthened, the etching profile of pattern having the high aspect ratio can be controlled with high accuracy.

Figure 12C:
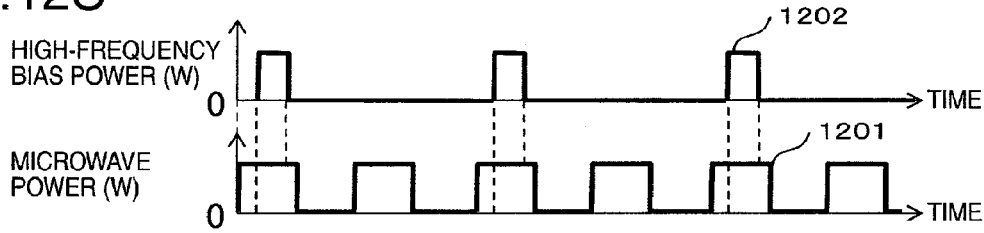

Next, the case where a delay time for the on-period of the modulation pulse 1201 of the microwave power is provided to delay the on-period of the modulation pulse 1202 for the high-frequency bias power as compared with the embodiment shown in FIG. 12B is shown in FIG. 12C. In this case, the delay time for the on-period of the modulation pulse of the microwave power is provided to delay the on-period of modulation pulse of high-frequency bias power, so that since the high-frequency bias power is not applied during the delay time, Vpp can be suppressed from being increased just after turning on of the microwave power and the mask selectivity can be further improved.

Figure 12D:
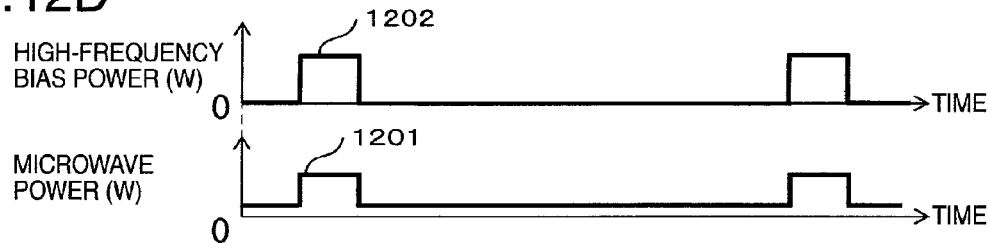

Next, the case where the on-period of the modulation pulse 1201 of microwave power is made equal to the on-period of the modulation pulse 1202 of high-frequency bias power so that the on-period of the modulation pulse 1201 of microwave power is synchronized with the on-period of the modulation pulse 1202 of high-frequency bias power and the frequency of the modulation pulse of microwave power is made equal to that of the high-frequency bias power and a value of microwave power at off-period of modulation pulse of microwave power is not zero is shown in FIG. 12D. However, the value that is not zero is larger than or equal to a value at which afterglow discharge can be maintained or is smaller than or equal to a value at which side etching caused by active radical occurs.

In this case, since the afterglow discharge can be maintained during off-period of the microwave power, the side etch caused by active radical can be suppressed and increase of Vpp can be also suppressed, so that the etching profile can be controlled with high accuracy and the mask selectivity can be improved.

Figure 12E:
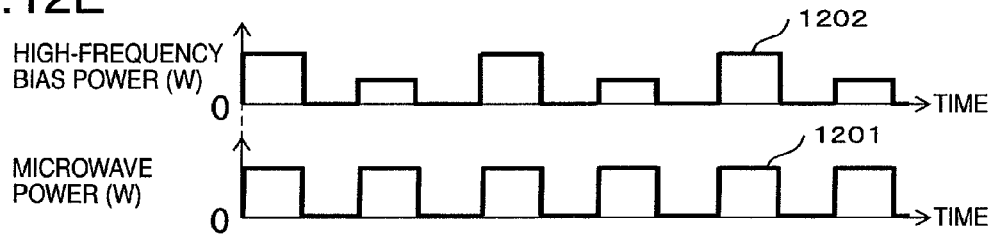

Next, the case where on-period of the modulation pulse having amplitude smaller than amplitude at on-period of the modulation pulse of high-frequency bias power is provided during off-period of the modulation pulse 1202 of high-frequency bias power in the case of the embodiment shown in FIG. 3 is shown in FIG. 12E.

There is a case where the etching rate is reduced in case of FIGS. 3 and 12A to 12D, although when output value of the high-frequency bias power is increased or on-period of modulation pulse of high-frequency bias power is lengthened in order to suppress reduction in the etching rate, it is considered that Vpp is increased or etch stop occurs. However, by using the measure of FIG. 12E, increase of Vpp can be suppressed and the etching profile can be controlled with high accuracy while the etching rate is maintained.

Control for time-modulating the microwave power and the high-frequency bias power according to the present invention as described in the above embodiments is made by a control device (not shown) provided in the pulse generation device 118.

Further, when Vpp is monitored by the pulse generation device 118 and is higher than a predetermined Vpp, the frequency of modulation pulse of microwave power can be made higher to make Vpp lower than the predetermined Vpp.

For example, when the mask material 401 is silicon nitride layer, the material 402 to be etched is polysilicon layer and the etching gas is a mixture of HBr gas and $O_2$, the mask selectivity is reduced when Vpp exceeds 500V and accordingly when Vpp is higher than 500V while monitoring Vpp, the frequency of modulation pulse of microwave power can be increased by feedback control to thereby make Vpp lower than 500V.

In other words, by monitoring Vpp by means of the pulse generation device 118, remarkable increase of Vpp can be suppressed and improvement of the etching selectivity and high-accuracy processing of etching profile can be realized to improve the production efficiency of semiconductor devices.

In the above embodiments, the example using the plasma etching apparatus utilizing microwave ECR (Electron Cyclotron Resonance) discharge has been described, although even if the present invention is applied to the plasma etching apparatus utilizing effective magnetic field UHF (Ultra High Frequency) discharge, capacitance-coupled discharge, induction-coupled discharge, magnetron discharge, surface-wave excitation discharge, transfer-coupled discharge or the like, the same effects as the present invention can be attained.

The present invention is not limited to the above embodiment and various modification examples can be contained. For example, the above embodiments have been described in detail in order to explain the present invention clearly and the present invention is not necessarily limited to provide all constituent elements described.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
    a processing chamber which plasma-processes a sample;
    a first high-frequency power supply which supplies first high-frequency power at a first high-frequency for plasma generation to the processing chamber;
    a second high-frequency power supply which supplies second high-frequency power at a second high-frequency to a sample stage on which the sample is placed; and
    a pulse generation device, including a control device, which generates a first pulse to modulate the first high-frequency power and a second pulse to modulate the second high-frequency power,
    wherein the control device is configured to control a frequency of the first pulse and a frequency of the second pulse so that the frequency of the first pulse is higher than the frequency of the second pulse, and wherein the on-period of the second pulse is equal to the on-period of the first pulse, and a start time of the on-period of the second pulse synchronizes with a start time of one of the on-periods of the first pulse.

2. The plasma processing apparatus according to claim 1, wherein the pulse generation device monitors a peak-to-peak voltage Vpp of a high-frequency voltage applied to the sample stage from the second high-frequency power supply; and wherein, when the monitored Vpp is higher than a predetermined value, the pulse generation device increases the frequency of the first pulse so that the monitored Vpp is lower than the predetermined value.

3. A plasma processing method, comprising:

providing, by a first high-frequency power supply, a first high-frequency power at a first high-frequency to a processing chamber for plasma generation;

providing, by a second high-frequency power supply, a second high-frequency power at a second high-frequency to a sample stage;

generating, by a pulse generation device, a first pulse to modulate the first high-frequency power and a second pulse to modulate the second high-frequency power, a frequency of the first pulse being higher than a frequency of the second pulse;

modulating the first high-frequency power using the first pulse;

modulating the second high-frequency power using the second pulse; and while the modulated second high-frequency power is being provided to the sample stage, processing a sample using plasma generated by the modulated first high-frequency power, wherein the on-period of the second pulse is equal to the on-period of the first pulse, and a start time of the on-period of the second pulse synchronizes with a start time of one of the on-periods of the first pulse.

4. The plasma processing method according to claim 3, further comprising:

monitoring, by the pulse generation device, a peak-to-peak voltage Vpp of a high-frequency voltage applied to the sample stage from the second high-frequency power supply; and when the monitored Vpp is higher than a predetermined value, increasing the frequency of the first pulse so that the monitored Vpp is lower than the predetermined value.

* * * * *